United States Patent [19]

Lichtenberg

[11] 4,205,266
[45] May 27, 1980

[54] METHOD AND APPARATUS TO DETERMINE THE PROXIMITY OF A PERMANENT MAGNET USING A MAGNETOMETER

[75] Inventor: Heinz D. Lichtenberg, Houston, Tex.

[73] Assignee: Dresser Industries, Inc., Dallas, Tex.

[21] Appl. No.: 960,679

[22] Filed: Nov. 13, 1978

Related U.S. Application Data

[63] Continuation of Ser. No. 787,199, Apr. 13, 1977, abandoned.

[51] Int. Cl.² .................................................. G01R 33/02
[52] U.S. Cl. ........................................ 324/253; 324/221;
324/207; 33/178 F
[58] Field of Search .............. 324/253, 254; 33/178 E, 33/178 F

[56] References Cited

U.S. PATENT DOCUMENTS

| | | | |
|---|---|---|---|
| 2,281,960 | 5/1942 | Vacquier | 33/178 E |
| 2,640,271 | 6/1953 | Boucher | 33/178 F |
| 2,736,967 | 3/1956 | Doll | 33/178 F |
| 3,218,547 | 11/1965 | Ling | 324/254 |
| 3,246,219 | 4/1966 | Devol et al. | 324/254 |
| 3,249,915 | 5/1966 | Koerner | 324/254 |
| 3,319,161 | 5/1967 | Beynon | 324/254 |
| 3,453,531 | 7/1969 | Warren | 324/254 |

FOREIGN PATENT DOCUMENTS

1908011 10/1969 Fed. Rep. of Germany .
700751 12/1953 United Kingdom .
1248567 10/1971 United Kingdom ..................... 324/253

*Primary Examiner*—Rudolph V. Rolinec
*Assistant Examiner*—Walter E. Snow
*Attorney, Agent, or Firm*—Richard M. Byron

[57] ABSTRACT

An electromagnetic sensing system is disclosed for sensing the linear distance between two elements and generating a signal related to the distance. The sensing system utilizes a magnetized initiator as one element, and a magnetic fluxgate as the second element. The magnetic fluxgate creates a flux "window" by locating a biased toroidal saturating coil inside a sensing coil, both of which are located inside a non-magnetic sleeve having an opening or "window" to magnetic flux, with the window being focused on the initiator magnet.

4 Claims, 5 Drawing Figures

METHOD AND APPARATUS TO DETERMINE THE PROXIMITY OF A PERMANENT MAGNET USING A MAGNETOMETER

This is a continuation of application Ser. No. 787,199 filed Apr. 13, 1977 now abandoned.

BACKGROUND OF THE INVENTION

The present invention generally discloses apparatus for measuring wellbores and more specifically involves calipers for measuring the diameter of a wellbore. It is known in the art to measure a wellbore with a caliper tool, which utilizes a sensing element such as a sliding potentiometer. The prior art devices utilize spring loaded arms to maintain contact with the wellbore wall and have connected to the sliding arms one or more elements of an electric potentiometer for determining the instantaneous borehole diameter.

The disadvantages suffered by this type of device include the exposure of the potentiometer wiring and parts to downhole conditions which lead to corrosion and failure of these parts. The prior art devices utilizing the potentiometer also suffer from the disadvantage of having internal sliding electronic components that wear mechanically and lead to inaccuracies and failure of the electrical system. The mechanical lead-ins to the potentiometer devices require structure for equalizing pressure between the inside of the tool and the wellbore. Also, pressure terminals through which the electrical and mechanical lead-ins pass must be sealed off against pressure and corrosive fluids.

The present invention disposes of these disadvantages by providing a magnetic sensing system to replace the complicated potentiometer system of the prior art devices. The magnetic sensing system is located behind a magnetic window which seals off and protects the electronics from well fluids and pressures. The only thing exposed to well fluids is the initiator magnet and the mechanical linkage connecting it to the caliper arms.

DESCRIPTION OF THE PREFERRED EMBODIMENTS

Figure 1A:
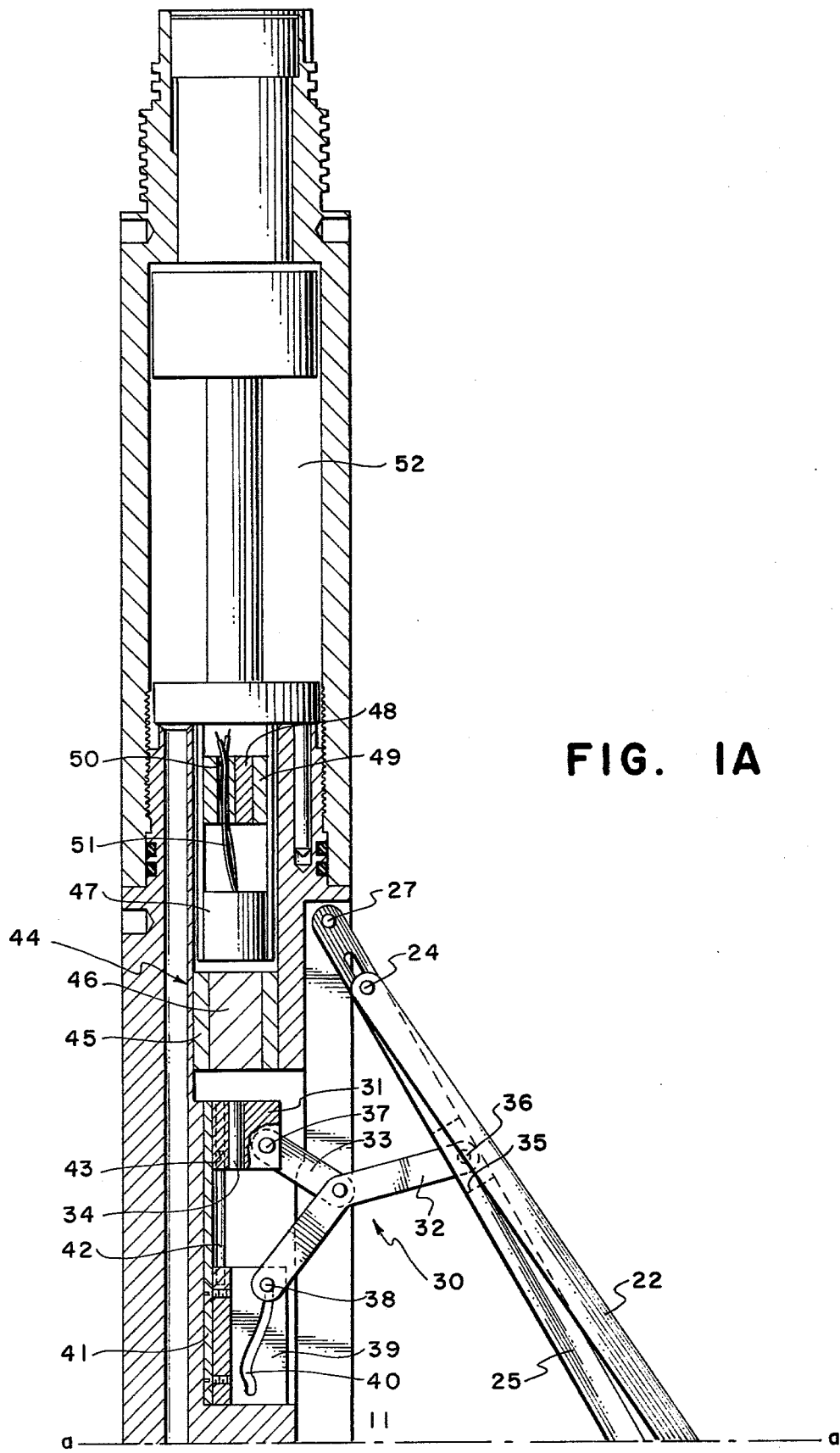
FIGS. 1A through 1C, when joined together at common lines a—a and b—b, illustrate in cross-sectional side view the caliper apparatus of this invention.
Figure 1B:
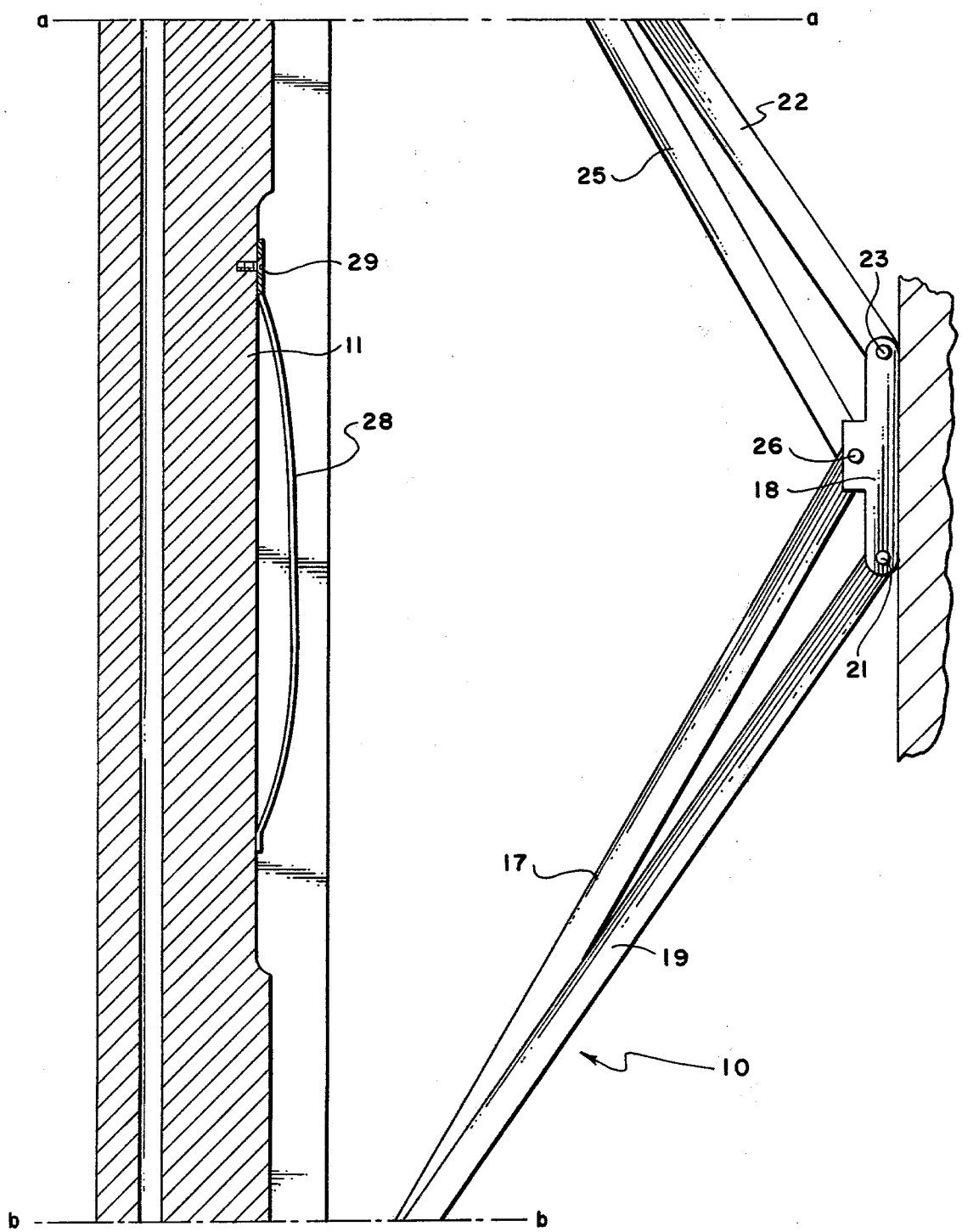
Figure 1C:
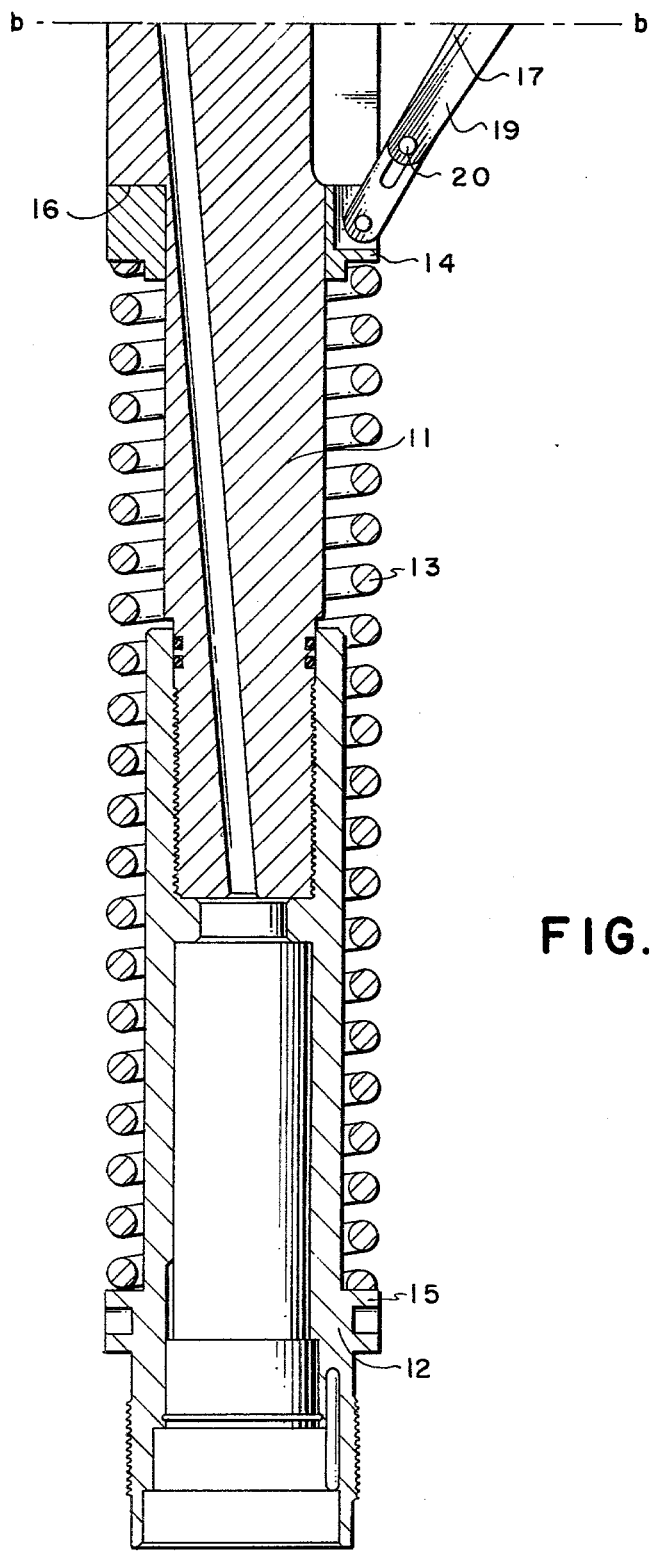

Referring to FIGS. 1A through 1C, there is illustrated the borehole caliper 10 having a generally cylindrical main body section 11 upon which is located a lower connection sleeve 12 and a coil expansion spring 13. A sliding collar 14 is located atop coil spring 13 and coil spring 13 rests on an annular abutment shoulder 15. Coil spring 13 preferably is in constant compression and continuously urges collar 14 upward towards abutment with shoulder 16.

Attached to collar 14 is a pivotal arm member 17 having at its outermost end a contact pad 18 pivotally connected thereto. A secondary arm member 19 is pivotally and slidably connected at pin 20 to arm 17 and pivotally connected at pin 21 to contact pad 18.

Also pivotally connected to pad 18 is an upper secondary arm member 22 connected thereto by pin 23, and slidably and pivotally connected at pin 24 to the upper primary arm member 25. Primary arm member 25 is connected at the same pin member 26 on pad 18 as arm member 17. Primary arm 25 is connected to body 11 at pivot pin 27.

It should be noted that although one arm assembly is illustrated with respect to this tool, it is possible to include one or more additional arm assemblies on the tool. When multiple arm assemblies are utilized they may or may not be equispaced around the tool body. One reason for using multiple arm assemblies in equi-spaced relationship is to centralize the tool body in the borehole. Conversely, other arrangements of arm assemblies may be used when it is not desirable to centralize the tool body. In one preferred embodiment, three such arm assemblies are provided in equispaced relationship on the body to maintain the instruments centralized in the wellbore.

Operation of the arm assemblies in conjunction with the movement of the caliper through the wellbore is substantially identical to the operation of the caliper disclosed in U.S. Pat. No. 3,977,468 assigned to Dresser Industries, Inc. assignee of the present invention. The specification of the above patent is herein incorporated by reference into this application.

A bow spring 28 is attached by means such as a threaded screw 29 to body 11 between arms 17 and 25 in a normally outward-flex position to initiate opening of the arm assembly and prevent lock-up of the assembly against the tool body. One primary purpose of the linkages comprising arms 17, 19, 22 and 25 and contact pad 18 is to maintain contact with the borehole wall and center the caliper instrument in the borehole. Coil spring 13 provides a continuous radially outward biasing force on the arm assembly.

In addition to the arm linkage above described, a correction linkage system 30 is provided in the borehole caliper for linking the arm assembly to a sliding signal initiator 31 having an internal magnet 34 embedded therein. The correction linkage assembly comprises a follower arm 32 having a drive arm 33 rotatably pinned thereto.

Arm 32 extends into a slot 35 machined inside arm 25 and is pinned therein in rotatable relationship by pin 36. Drive arm 33 is rotatably attached to initiator 31 by rotatable pin 37. At the other end arm 32 has located therein a pin 38 which is continuously engaged in a follower channel 40 formed in the side face of follower block 39. Pin 38 and arm 32 are attached to block 39 in a manner preventing pin 38 from disengaging channel 40 at any time during operation of the instrument.

Initiator block 31 is slidably located on a slide plate 41 secured to the lower end of block 39. A guide rod 42 is securely embedded in follower block 39 and extends into snug fitting slidable relationship in a bore passage 43 formed in initiator block 31. The central longitudinal axis of initiator magnet 34 is maintained generally parallel to the longitudinal axis of the caliper instrument.

Also, in general coaxial alignment with magnet 34 is a magnetic window 44 comprising a non-magnetic shield sleeve 45 and a core 46 made of a magneticly permeable material such as soft iron. Directly behind the magnetic window 44 is the magnetic fluxgate 47. A biasing magnet 48 is located behind the fluxgate 47 and is secured inside an insulating plug 49. A conduit passage 50 is formed through plug 49 for passage of the fluxgate wiring 51. The wiring extends into a conventional logging tool electronics section 52.

Figure 2:
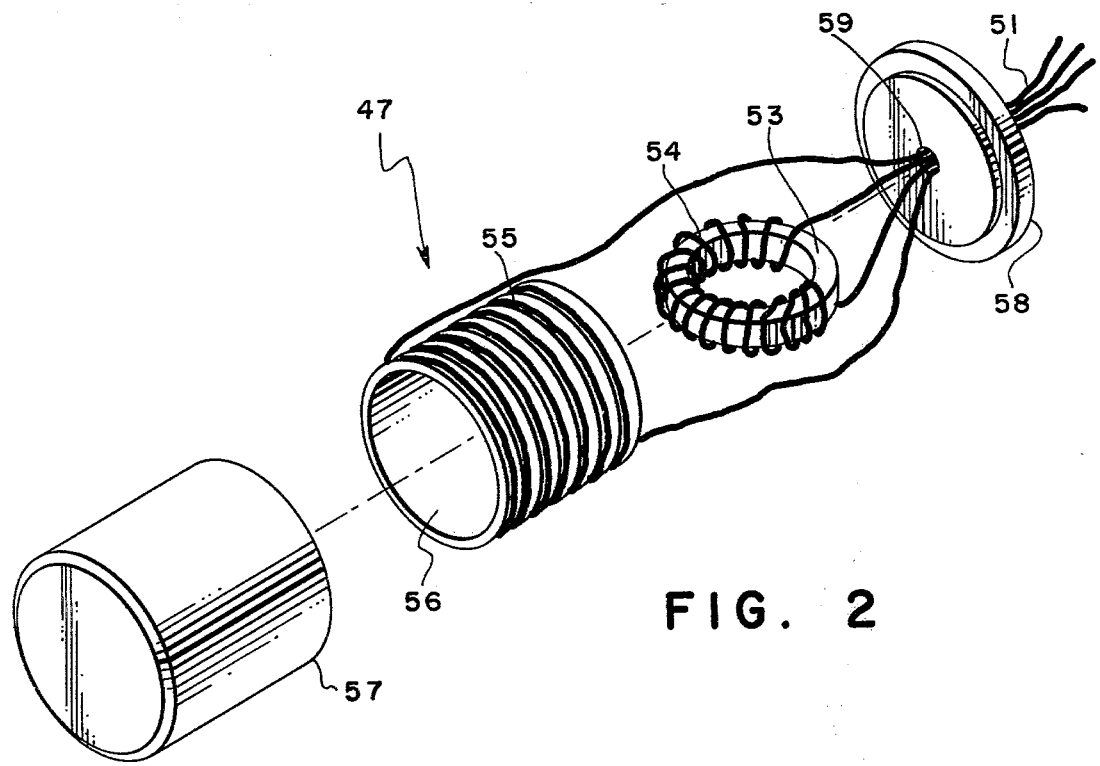
FIG. 2 represents in schematic illustration the components of the magnetic fluxgate utilized in the invention.

Referring now to FIG. 2, the magnetic fluxgate is illustrated in schematic view. The fluxgate generally comprises a drive mechanism consisting of a toroidal core 53 with a square loop characteristic, on which have been wound a sufficient number of turns 54 to drive the core into saturation. A sensing coil 55 is wound on an aluminum bobbin 56 with the aluminum bobbin acting as an electrostatic shield. The sensing coil and aluminum bobbin are located around the drive mechanism and this assembly is mounted inside a brass case 57 and closed with a suitable brass end plate 58 having a conduit passage 59.

Figure 3:
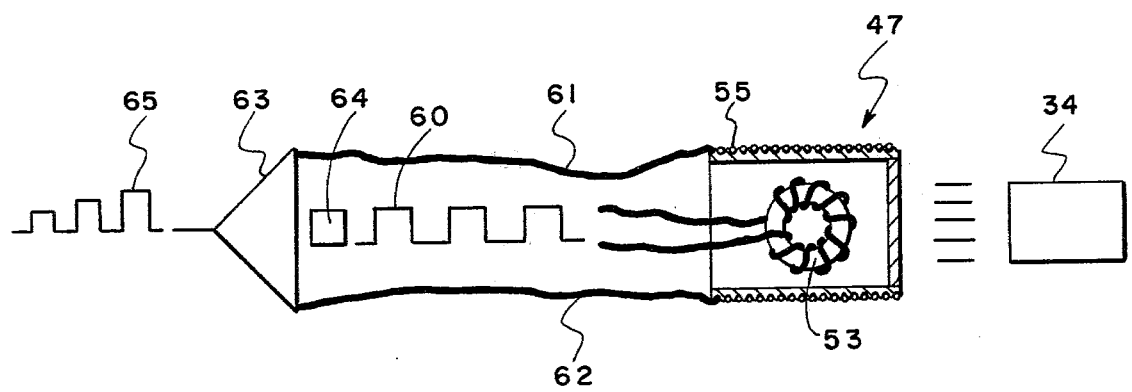
FIG. 3 is a schematic illustration of the circuitry of the magnetic fluxgate.

Referring now to FIG. 3, a schematic diagram of the circuitry of the magnetic fluxgate is disclosed. The fluxgate assembly 47 is located in a stationary position in the caliper tool. The sliding magnet 34 is located opposite the magnetic window 44 (FIG. 1A) which is in close proximity to fluxgate 47. A step voltage 60 is supplied to toroidal coil, which voltage alternately drives the core 53 into saturation and then allows it to come out of saturation.

The sensing coil 55 is connected by leads 61 and 62 to an amplifier 63 which feeds into the electronics section 52 of the caliper. A biasing magnet 64 is located behind the fluxgate to shift the zero point upward into the region of higher voltage where a better signal-to-noise ratio can be obtained.

During operation of the fluxgate assembly, the toroidal core 53 is alternately driven into and out of saturation by application of step voltage 60. During saturation, the flux from magnet 34 entering magnet window 44 is driven out of the sensing coil 55. At the end of each saturation stage, the toroidal core moves into a non-saturated condition and flux from magnet 34 moves into sensing coil 55 inducing a voltage therein which is amplified at 63. This results in a stepped signal 65 representing a voltage related to the intensity of the flux from magnet 34.

This output of the fluxgate from sensing coil 55 is an amplitude-modulated carrier of the same frequency as the input voltage 60. The output 65 is further processed in the electronics section 2 and may be transmitted as a DC voltage via a logging cable to electronic instruments at the surface. This DC voltage is related to the flux density of magnet 34 which in turn varies with the distance of the magnet from fluxgate 47.

In typical operation, the apparatus described with reference to FIGS. 1-3 serves to provide a signal related to the diameter of the wellbore. This is accomplished by the expansion of the linkage arms 17, 19, 22 and 25 radially outward, forcing the contact pad 18 into continuous contact with the borehole wall as the logging instrument moves upward in the borehole.

Variations in the borehole will cause radial movement of pad 18 with respect to tool body 11 as the tool moves along the borehole. In this preferred embodiment, the tool is provided with three sets of linkage arms and contact pads, although only a single set is illustrated. This illustrated assembly is typical of the other two arm mechanisms and all three mechanisms are generally located in equispaced relationship around the circumference of the tool body. The operation of the linkage arms and contact pads with movement of the instrument along the wellbore is more particularly described in the aforementioned U.S. Pat. No. 3,977,468 which was incorporated by reference.

One set of linkage arms is provided with the mechanical correction linkage assembly 30 converting the non-linear radial movement of pad 18 into linear movement of the sliding magnet 34. Thus, with the provision of linkage arm 32 having a follower pin 38 engaged in a follower channel 40, the movement of magnet 34 along the longitudinal axis of body 11 is linearly related to the movement of pad 18 radially inward and outward from body 11. This removes the non-linear component arising from the polar action of the linkage arm 25 about pin 27.

This conversion of radial movement of pad 18 into directly linear coaxial movement of magnet 34 results in a magnetic flux entering magnetic window 44, having a flux density exponentially related to the radial extension of pad 18 from body 11. Since the flux density of coil 34 sensed in fluxgate 47 is not linearly proportional to the distance of magnet 34 from the fluxgate, this non-linear magnetic component may be converted into a linear signal either in electronics section 52 or in the control panel instruments located on the ground.

The advantages of the present invention are obvious from the description given above and include the fact that the entire electronics system may be secluded in the body section and sealed off by the magnetic window 44, thus eliminating the aforementioned problems of exposed wiring and pressure seals needed in the potentiometer type devices. The present invention also eliminates the internal sliding electrical parts that suffer wear from friction encountered in the potentiometer device. There also is no requirement for a pressure equilization system using bellows and hydraulics such as utilized in the potentiometer calipers.

The only exposure to the well fluid in this invention is the initiator magnet and the mechanical linkage connecting it to the caliper arms. The mechanical linkage assembly 30 is reliable and uncomplicated and serves to remove a complex non-linearity component of movement in the caliper system. The selection of the proper curve for channel 40 depends upon physical characteristics of the caliper arm assemblies such as the various lengths of the various arms, the physical dimensions of the contact pads and the locations of the pivot pins connecting the arms and pads to each other and to the body.

Although a specific preferred embodiment of the present invention has been described in the detailed description above, the description is not intended to limit the invention to the particular forms or embodiments disclosed therein since they are to be recognized as illustrative rather than restrictive and it will be obvious to those skilled in the art that the invention is not so limited. For example, whereas certain materials are cited for the construction of components within the fluxgate, it is obvious that other suitable materials could be substituted therefore. Also, whereas a toroidal core having a square loop configuration is utilized as the driving coil, it is obvious other configurations of driving coils could be utilized. Additionally, it is possible to substitute an eddy current sensor or radioactive sensing system for the magnetic fluxgate system and still retain many of the advantages of the magnetic system. These and all other modifications and changes of this type are deemed to be embraced by the spirit and scope of the invention except as the same may be necessarily limited by the appended claims or reasonable equivalents thereof.

The embodiments of the invention in which an exclusive property or privilege is claimed are defined as follows:

1. A magnetic flux sensor apparatus, for generating a signal functionally related to the distance said sensor apparatus is located from a magnet comprising:
   a non-magnetic metallic housing;
   a sensing coil wound coaxially around the outer circumference of a tubular bobbin formed from a non-magnetic metallic material;
   said coil wound bobbin positioned inside said non-magnetic metallic housing and arranged to generate a first electrical signal in response to external magnetic flux impinging said coil from outside said housing;
   a drive coil wound on a doughnut shaped toroidal core, having a square loop characteristic, said drive coil and doughnut shaped core positioned completely inside said tubular bobbin;
   a magnetic window, formed by a non-magnetic sleeve surrounding a magnetically permeable material and located between said magnetic flux sensor and said magnet;
   a biasing magnet positioned in a predetermined spaced relation to said housing;
   voltage means connected to said drive coil for impressing a square wave voltage across said drive coil, said impressed voltage operative to drive said drive core to saturation for preventing said external magnetic flux from impinging said sensing coil; and
   a signal transmitter system connected to said sensing coil for receiving said generated first electrical signal and transmitting a second electrical signal relating thereto.

2. A method of measuring the proximity of an external magnet to a sensing position, said method comprising the steps of:
   winding a sensing coil coaxially around the outer circumference of a tubular bobbin formed of a non-magnetic metallic material;
   placing said sensing coil wound bobbin inside a non-magnetic metallic housing;
   locating said housing, said sensing coil and bobbin in said sensing position to cut the magnetic flux of the external magnet to thereby induce a voltage in said sensing coil;
   placing within said tubular bobbin a drive coil wound on a doughnut shaped toroidal core, having a square loop characteristic, said core capable of saturation;
   locating a magnetic window, formed by a non-magnetic sleeve about a magnetically permeable material between said magnet and said housing;
   placing a bias magnet behind said sensing position, arranged to step the induced voltage signal into a range of higher signal-to-noise ratio;
   applying a periodic square wave voltage to said drive coil sufficient to alternately drive said toroidal core into and out of saturation, said core being arranged, when saturated, to prevent the magnetic flux from reaching said sensing coil; and
   conducting the voltage induced in the sensing coil by said magnetic flux from the external magnet to means for measuring the amplitude of said induced voltage and translating said amplitude into a signal being functionally related to the distance of said sensing coil from said external magnet.

3. The measuring method of claim 2 further comprising the step of applying a biasing magnetic field to said sensing coil to reduce the signal-to-noise ratio.

4. A magnetic flux sensor apparatus, for use with a wellbore caliper assembly having an elongated body member and a resiliently biased pivotable arm radially extendable and retractable with respect to the body member, for generating an electrical signal functionally related to the distance the arm extends radially outward from the body member, comprising:
   a magnet connected by linearized linkage means to the pivotable arm and positioned within the caliper assemble and linearly slidable along the longitudinal length thereof in response to non-linear movement of the arm radically with respect to the body member;
   a non-magnetic metallic housing positioned in the body member is spaced relation to said magnet so that an external magnetic flux field generated by said magnet impinges said housing;
   a magnetic window formed by a non-magnetic window surrounding a magnetically permeable material, said window being located between said magnetic and said housing and sealing the housing from the external environment;
   a sensing coil wound coaxially around the outer circumference of a tubular bobbin formed from a non-magnetic metallic material;
   said coil wound bobbin positioned inside said non-magnetic metallic housing and arranged to generate a first electrical signal in response to external magnetic flux impinging said coil through said housing;
   a drive coil wound on a doughnut shaped, toroidal core, said core having a square loop characteristic, said drive coil and core positioned entirely inside tubular bobbin;
   a square wave voltage means connected to said drive coil for impressing a voltage across said drive coil, said impressed voltage operative to drive said core to saturation for preventing said external flux from impinging said sensing coil;
   a biasing magnet, located behind said housing containing said sensing and drive coils, arranged to step the induced voltage signal into a range of higher signal-to-noise ratio;
   a signal transmitter system connected to said sensing coil, for receiving said generated first electric signal and transmitting a second electrical signal relative thereto, said second electrical signal being functionally related to the distance the arm extends radially outward from the body member.

* * * * *